(12) United States Patent
Seo

(10) Patent No.: US 7,477,562 B2
(45) Date of Patent: Jan. 13, 2009

(54) SEMICONDUCTOR MEMORY DEVICE AND A REFRESH CLOCK SIGNAL GENERATOR THEREOF

(75) Inventor: Eunsung Seo, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 413 days.

(21) Appl. No.: 11/438,926

(22) Filed: May 23, 2006

(65) Prior Publication Data

US 2007/0036017 A1     Feb. 15, 2007

(30) Foreign Application Priority Data

Aug. 10, 2005   (KR) .................. 10-2005-0073496

(51) Int. Cl.
*G11C 7/00*     (2006.01)
(52) U.S. Cl. ............. 365/222; 365/189.09; 365/189.11; 365/233.1
(58) Field of Classification Search ............ 365/189.09, 365/189.11, 222, 233.1
See application file for complete search history.

(56) References Cited

U.S. PATENT DOCUMENTS 6,731,558 B2 * 5/2004 Yamauchi et al. ........... 365/222
6,813,210 B2 * 11/2004 Okamoto et al. ............ 365/222

FOREIGN PATENT DOCUMENTS

| JP | 05-307882 | 11/1993 |
|---|---|---|
| JP | 2002-117671 | 4/2002 |
| JP | 2003-132678 | 5/2003 |
| KR | 1020020002659 A | 1/2002 |
| KR | 1020040048750 A | 6/2004 |

* cited by examiner

Primary Examiner—Hoai V Ho
(74) Attorney, Agent, or Firm—F. Chau & Associates, LLC

(57) ABSTRACT

A semiconductor memory device and a refresh clock signal generator thereof are provided. The refresh clock signal generator of the semiconductor memory device includes a voltage generator for receiving a power voltage to generate a voltage which is lower than the power voltage; a ring oscillator enabled in response to a self refresh control signal, including an odd number of at least three inverters, having a first current consumption when a temperature of the semiconductor memory device is high and a second current consumption when the temperature is low, and generating a clock signal whose cycle is increased as the temperature is lowered; and a level shifter for converting the clock signal of the voltage which is lower than the power voltage into a refresh clock signal which has a level of the power voltage.

23 Claims, 7 Drawing Sheets

SEMICONDUCTOR MEMORY DEVICE AND A REFRESH CLOCK SIGNAL GENERATOR THEREOF

CROSS-REFERENCE TO RELATED APPLICATION

This application claims priority to Korean Patent Application No. 2005-73496, filed Aug. 10, 2005, the disclosure of which is incorporated by reference herein in its entirety.

BACKGROUND OF THE INVENTION

1. Technical Field

The present invention relates to a semiconductor memory device and, more particularly, to a semiconductor memory device which performs a refresh operation and a refresh clock signal generator thereof.

2. Discussion of the Related Art

Semiconductor memory devices can generally be categorized as volatile memory devices and nonvolatile memory devices. Volatile memory devices include dynamic random access memory (DRAM) and static random access memory (SRAM), etc. Nonvolatile memory devices include flash memory or read only memory (ROM), etc.

Volatile memory devices are divided into two categories according to whether a recharge operation of data is required. For example, an SRAM cell is generally constructed of a flip-flop circuit and two switches, and data storage can be obtained as long as power is applied. A DRAM cell, on the other hand, includes one capacitor and one transistor. The DRAM cell stores data by accumulating charges in a capacitor; however, data stored in the capacitor disappears after a predetermined time lapses.

To prevent loss of data, data within the DRAM cell is read, and an initial charge must be replenished in conformity with the read information. This operation is repeated periodically to maintain data stored in the DRAM cell. Such a recharge procedure is referred to as a refresh operation.

FIG. 1 is a block diagram illustrating a conventional semiconductor memory device having dynamic memory cells. The semiconductor memory device of FIG. 1 includes a self refresh control signal generator 10, a refresh clock signal generator 12, a refresh address generator 14, a row address decoder 16, and a memory cell array 100.

Functions of the semiconductor memory device of FIG. 1 will be explained below.

The self refresh control signal generator 10 counts a self refresh cycle to generate a self refresh control signal SEF. The refresh clock signal generator 12 is enabled in response to the self refresh control signal SEF to generate a refresh clock signal CLK. The refresh address generator 14 performs a counting operation in response to the refresh clock signal CLK to generate a refresh row address radd. The row address decoder 16 decodes the refresh row address radd to generate a word line enable signal for enabling one of n word lines WL1 to WLn. The memory cell array 100 performs a refresh operation for the memory cells of the word line selected in response to the word line enable signal. Here, the refresh operation reads data of the selected word line via a bit line, then amplifies the data by using a bit line sense amplifier and then writes the data again.

FIG. 2 is a block diagram illustrating a conventional refresh clock signal generator. The refresh clock signal generator of FIG. 2 includes a temperature detector 20 and an oscillator 22.

Functions of the refresh clock signal generator of FIG. 2 will be explained below.

The temperature detector 20 detects an internal temperature, for example, of the semiconductor memory device of FIG. 1, and varies an output voltage Vref according to a temperature variation. The oscillator 22 generates the refresh clock signal CLK whose cycle varies according to the output voltage Vref. The oscillator 22 generates the refresh clock signal CLK with a short cycle in a high temperature section and the refresh clock signal CLK with a long cycle in a low temperature section. In other words, the refresh clock signal CLK with a short cycle is generated when the temperature is high and the refresh clock signal CLK with a lo long cycle is generated when the temperature is low. An example of the refresh clock signal generator of FIG. 2 is disclosed in Korean Patent Publication No. 2002-2659 and its related U.S. Pat. No. 6,597,614, copies of which are incorporated by reference herein in their entirety.

Although the refresh clock signal generator of FIG. 2 can reduce power consumption by varying a self refresh period, the refresh clock signal generator is complicated to design and occupies a large area. Accordingly, there exists a need for a refresh clock signal generator that consumes a small amount of power and that occupies a smaller surface area than a conventional refresh clock signal generator.

SUMMARY OF THE INVENTION

One aspect of the present invention is to provide a semiconductor memory device, comprising: a self refresh control signal generator for counting a self refresh cycle to generate a self refresh control signal; a refresh clock signal generator for generating a refresh clock signal in response to the self refresh control signal; a refresh address generator for generating a refresh row address in response to the refresh clock signal; a row decoder for generating word line selecting signals for selecting one of a plurality of word lines in response to the refresh row address; and a memory cell array including a plurality of memory cells connected to the word lines and performing a refresh operation for the memory cells connected to the selected word line in response to the word line selecting signal, wherein the refresh clock signal generator includes a voltage generator for receiving a power voltage to generate a voltage which is lower than the power voltage; a ring oscillator enabled in response to the self refresh control signal, including an odd number of at least three inverters, having a first current consumption when a temperature of the semiconductor memory device is high and a second current consumption when the lo temperature is low, and generating a clock signal whose cycle is increased as the temperature is lowered; and a level shifter for converting the clock signal of the voltage which is lower than the power voltage into the refresh clock signal which has a level of the power voltage.

Another aspect of the present invention is to provide a refresh clock signal generator of a semiconductor memory device, comprising: a voltage generator for receiving a power voltage to generate a voltage which is lower than the power voltage; a ring oscillator enabled in response to a self refresh control signal, including an odd number of at least three inverters, having a first current consumption when a temperature of the semiconductor memory device is high and a second current consumption when the temperature is low, and generating a clock signal whose cycle is increased as the temperature is lowered; and a level shifter for converting the clock signal of the voltage which is lower than the power voltage into a refresh clock signal which has a level of the power voltage.

The first current consumption is greater than the second current consumption. The first current consumption is increased as the temperature is raised when the temperature is high and the second current consumption is decreased as the temperature is lowered when the temperature is low.

The at least three inverters are at least three pseudo NMOS inverters which are cascade-connected; and the ring oscillator includes a reset transistor for resetting the clock signal in response to the self refresh control signal. Each of the pseudo NMOS inverters includes a PMOS transistor and an NMOS transistor which are serially connected between the voltage which is lower than the power voltage and a ground voltage, wherein a gate of the PMOS transistor is connected to the ground voltage, an output signal of a previous inverter is applied to a gate of the NMOS transistor, and the PMOS transistor and the NMOS transistor operate in a weak inversion region. Each of the pseudo NMOS inverters also includes first PMOS transistors and an NMOS transistor which are serially connected between the voltage which is lower than the power voltage and a ground voltage; fuses which are respectively connected in parallel to the first PMOS transistors; and second PMOS transistors which are respectively connected in parallel to the first PMOS transistors and which are controlled by control signals, wherein gates of the first PMOS transistors are connected to the ground voltage, an output signal of a previous inverter is applied to a gate of the NMOS transistor, and the first PMOS transistors and the NMOS transistor operate in a weak inversion region.

The at least three inverters are at least three pseudo PMOS inverters which are cascade-connected; and the ring oscillator includes a reset transistor for resetting the clock signal in response to the self refresh control signal. Each of the pseudo PMOS inverters includes a PMOS transistor and an NMOS transistor which are serially connected between the voltage which is lower than the power voltage and a ground voltage, wherein the voltage which is lower than the power voltage is applied to a gate of the NMOS transistor, an output signal of a previous inverter is applied to a gate of the PMOS transistor, and the PMOS transistor and the NMOS transistor operate in a weak inversion region. Each of the pseudo PMOS inverters also includes first NMOS transistors and a PMOS transistor which are serially connected between the voltage which is lower than the power voltage and a ground voltage; fuses which are respectively connected in parallel to the first NMOS transistors; and second NMOS transistors which are respectively connected in parallel to the first NMOS transistors and which are controlled by control signals, wherein gates of the first NMOS transistors are connected to the voltage which is lower than the power voltage, an output signal of a previous inverter is applied to a gate of the PMOS transistor, and the first NMOS transistors and the PMOS transistor operate in a weak inversion region.

The refresh clock signal generator further comprises a mode setting circuit for receiving an externally applied code to generate at least one of the control signals in response to a mode setting command during a mode setting operation.

The at least three inverters are at least three pseudo CMOS inverters which are cascade-connected; and a reset transistor for resetting the clock signal in response to the self refresh control signal. Each of the pseudo CMOS inverters includes one PMOS transistor and one NMOS transistor which are serially connected between the voltage which is lower than the power voltage and a ground voltage, wherein the PMOS transistor and the NMOS transistor operate in a weak inversion region.

The level shifter includes first through third inverters, first and second PMOS transistors and first and second NMOS transistors, wherein the first inverter for receiving the clock signal of the voltage which is lower than the power voltage is connected to a gate of the first NMOS transistor, the second inverter for receiving an inverted version of the clock signal of the voltage which is lower than the power voltage is connected to a gate of the second NMOS transistor, and the third inverter for outputting the refresh clock signal is connected to a node between the second PMOS transistor and the second NMOS transistor.

BRIEF DESCRIPTION OF THE DRAWINGS

The above and other features of the present invention will become more apparent to those of ordinary skill in the art by describing in detail exemplary embodiments thereof with reference to the attached drawings in which.

DETAILED DESCRIPTION OF EXEMPLARY EMBODIMENTS

Figure 3:
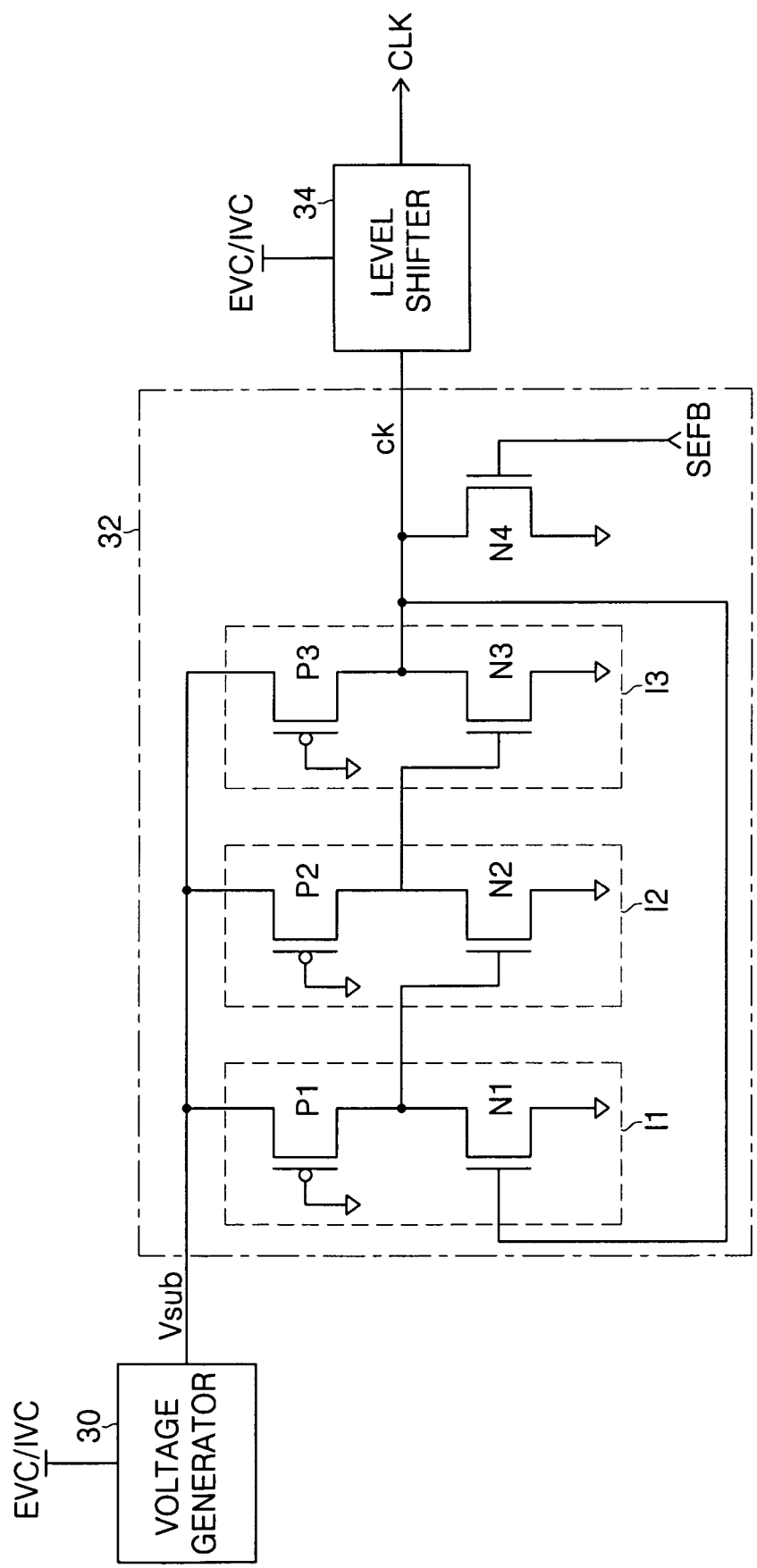
FIG. 3 is a circuit diagram illustrating a refresh clock signal generator according to a first exemplary embodiment of the present invention.

FIG. 3 is a circuit diagram illustrating a refresh clock signal generator of a semiconductor memory device according to a first embodiment of the present invention. The refresh clock signal generator of FIG. 3 includes a voltage generator 30, a ring oscillator 32, and a level shifter 34. The ring oscillator 32 includes PMOS transistors PI to P3 and NMOS transistors N1 to N4. The PMOS transistor P1 and the NMOS transistor N1, the PMOS transistor P2 and the NMOS transistor N2, and the PMOS transistor P3 and the NMOS transistor N3 constitute inverters I1 to I3, respectively. The ring oscillator 32 is configured such that the three inverters I1 to I3 are connected in the form of a ring. The inverters I1 to I3 constitute pseudo NMOS inverters.

Functions of the refresh clock signal generator of FIG. 3 will be explained below.

The voltage generator 30 receives an external power voltage EVC or an internal power voltage IVC to generate a voltage Vsub which is lower in level than the external power voltage EVC or the internal power voltage IVC. The ring oscillator 32 is enabled to generate a clock signal ck when the NMOS transistor N4 is turned off in response to an inverted self refresh control signal SEFB of a low level, and it is disabled when the NMOS transistor N4 is turned on in response to the inverted self refresh control signal SEFB of a high level. In the ring oscillator 32, the voltage Vsub is applied as a power voltage, and thus, the MOS transistors P1 to P3 and N1 to N3 operate in a weak inversion region. Here, the weak inversion region is referred to as a sub threshold voltage region or as a region where a voltage between gates and sources of the MOS transistors P1 to P3 and N1 to N3 becomes lower than a threshold voltage. When the MOS transistors P1 to P3 and N1 to N3 operate in the weak inversion region, consumption of an electric current through the MOS transistors P1 to P3 and N1 to N3 in a high temperature section is high, whereas consumption of an electric current through the MOS transistors P1 to P3 and N1 to N3 in a low temperature section is small. In other words, when the MOS transistors P1 to P3 and N1 to N3 operate in the weak inversion region, consumption of an electric current is high when the temperature is high and consumption of an electric current is low when the temperature is low. Thus, the ring oscillator 32 functions to reduce current consumption during the self refresh operation.

Since the electric current flowing through the MOS transistors P1 to P3 and N1 to N3 is reduced as a temperature is lowered, a cycle of the clock signal ck becomes longer. For the foregoing reason, the voltage Vsub for operating the MOS transistors P1 to P3 and N1 to N3 of the ring oscillator 32 in the weak inversion region should be set to a voltage which is lower than the external power voltage EVC or the internal power voltage IVC so that a voltage between the gates and the sources of the MOS transistors P1 to P3 and N1 to N3 can be equal to or smaller than a threshold voltage of the MOS transistors P1 to P3 and N1 to N3. The level shifter 34 receives the clock signal ck which toggles from a ground voltage to the voltage Vsub to generate a refresh clock signal CLK which toggles from the ground voltage to the external power voltage EVC or the internal power voltage IVC.

Figure 4:
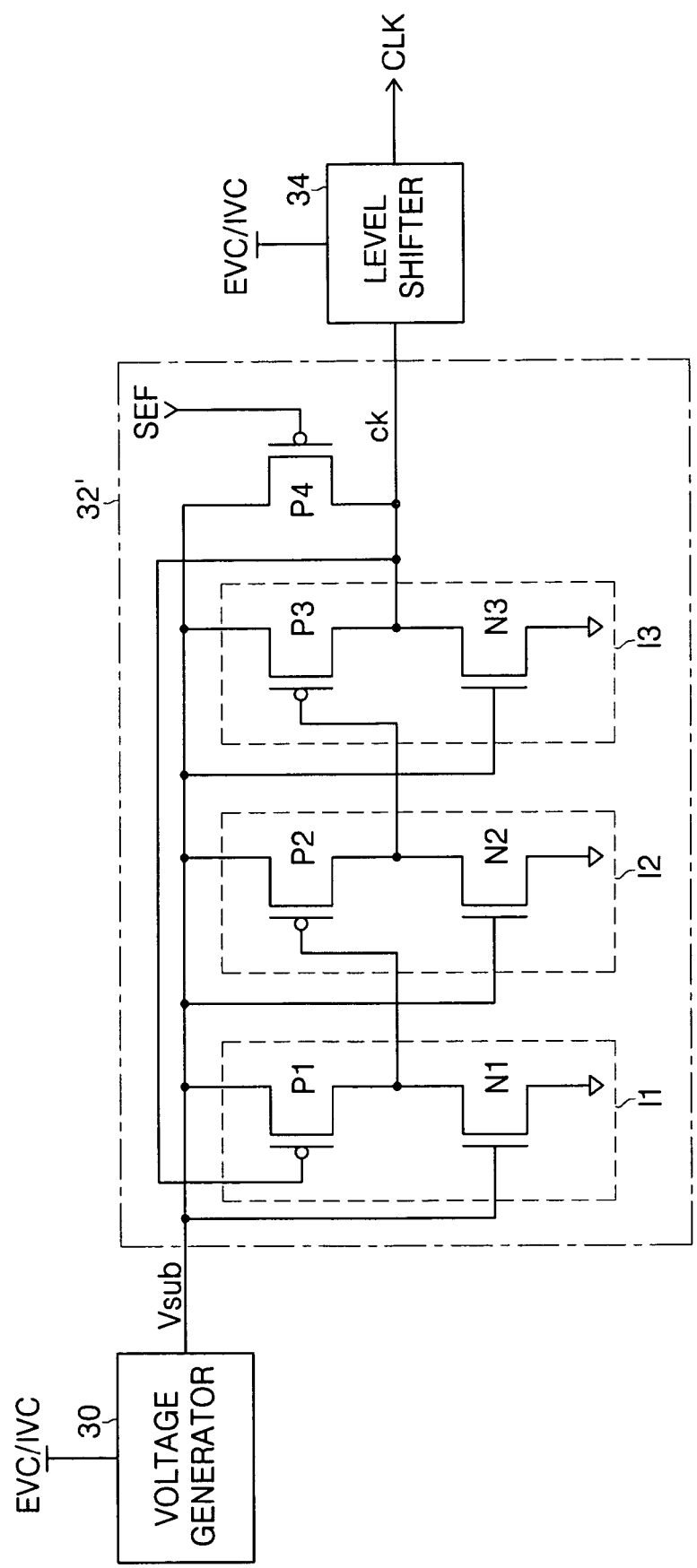
FIG. 4 is a circuit diagram illustrating a refresh clock signal generator according to a second exemplary embodiment of the present invention.

FIG. 4 is a circuit diagram illustrating a refresh clock signal generator of a semiconductor memory device according to a second embodiment of the present invention. The refresh clock signal generator of FIG. 4 includes a voltage generator 30, a ring oscillator 32', and a level shifter 34. The ring oscillator 32' includes PMOS transistors P1 to P4 and NMOS transistors N1 to N3. The PMOS transistor P1 and the NMOS transistor N1, the PMOS transistor P2 and the NMOS transistor N2, and the PMOS transistor P3 and the NMOS transistor N3 constitute inverters I1 to I3, respectively. The ring oscillator 32' is configured such that the three inverters I1 to I3 are connected in the form of a ring. The inverters I1 to I3 constitute pseudo PMOS inverters.

Functions of the refresh clock signal generator of FIG. 4 will be explained below.

Since functions of the voltage generator 30 and the level shifter 34 of FIG. 4 are similar to those of FIG. 3 a description thereof is omitted. The ring oscillator 32' is enabled to generate the clock signal ck when the PMOS transistor P4 is turned off in response to a self refresh control signal SEF of a high level, and it is disabled when the PMOS transistor P4 is turned on in response to the self refresh control signal SEF of a low level. In the ring oscillator 32', the voltage Vsub is applied as a power voltage, and the voltage Vsub is applied to gates of the NMOS transistors N1 to N3. Thus, the MOS transistors P1 to P3 and N1 to N3 operate in the weak inversion region. As a result, consumption of an electric current through the MOS transistors P1 to P3 and N1 to N3 in a high temperature section is high, whereas consumption of an electric current through the MOS transistors P1 to P3 and N1 to N3 in a low temperature section is small. Thus, the ring oscillator 32' functions to reduce current consumption during the self refresh operation.

Since the electric current flowing through the MOS transistors P1 to P3 and N1 to N3 is reduced as a temperature is lowered, a cycle of the clock signal ck becomes longer. For the foregoing reason, the voltage Vsub for operating the MOS transistors P1 to P3 and N1 to N3 of the ring oscillator 32 in the weak inversion region should be set to a voltage which is lower than the external power voltage EVC or the internal power voltage IVC so that a voltage between the gates and the sources of the MOS transistors P1 to P3 and N1 to N3 can be equal to or smaller than a threshold voltage of the MOS transistors P1 to P3 and N1 to N3.

Figure 5:
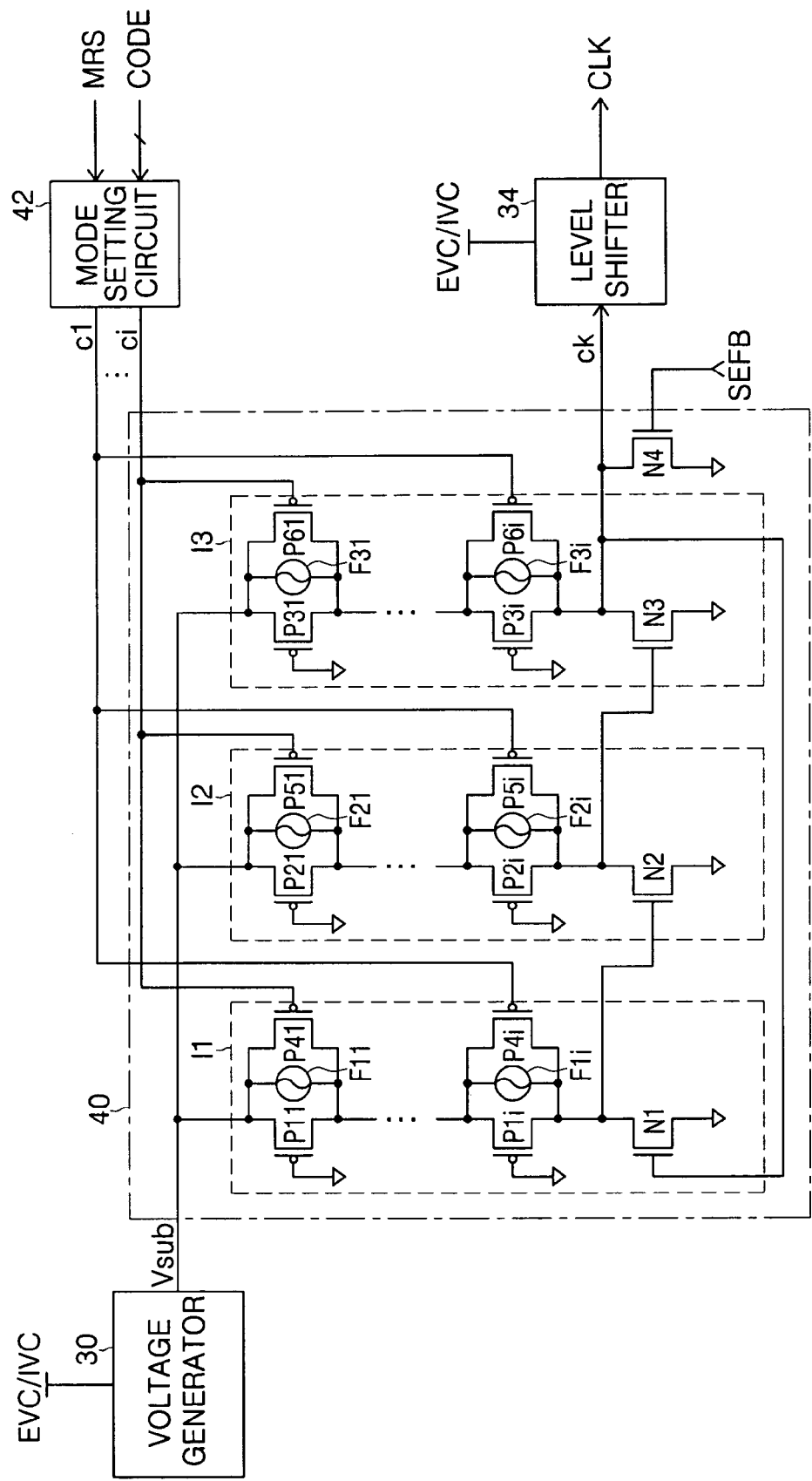
FIG. 5 is a circuit diagram illustrating a refresh clock signal generator according to a third exemplary embodiment of the present invention.

FIG. 5 is a circuit diagram illustrating a refresh clock signal generator of a semiconductor memory device according to a third embodiment of the present invention. The refresh clock signal generator of FIG. 5 includes a voltage generator 30, a ring oscillator 40, a level shifter 34, and a mode setting circuit 42. The oscillator 40 includes three inverters I1 to I3 which are cascade-connected to each other and an NMOS transistor N4. The inverter I1 includes PMOS transistors P11 to P1$i$ and P41 to P4$i$, fuses F11 to F1$i$, and an NMOS transistor N1. The inverter I2 includes PMOS transistors P21 to P2$i$ and P51 to P5$i$, fuses F21 to F2$i$, and an NMOS transistor N2. The inverter I3 includes PMOS transistors P31 to P3$i$ and P61 to P6$i$, fuses F31 to F3$i$, and an NMOS transistor N3. The inverters I1 to I3 constitute pseudo NMOS inverters.

Functions of the refresh clock signal generator of FIG. 5 will be explained below.

Since functions of the voltage generator 30 and the level shifter 34 are similar to those of FIG. 3 a description thereof is omitted. The mode setting circuit 42 receives a code signal CODE which is externally applied to generate control signals $c_1$ to $c_i$ in response to a mode setting command MRS applied during a mode setting operation. The ring oscillator 40 performs a function similar to the ring oscillator 32 of FIG. 3 except that the ring oscillator 40 can set a cycle of the clock signal ck. Since the cycle of the clock signal ck is short in a high temperature section, the cycle of the clock signal ck is set to be short. To accomplish this, the ring oscillator 40 adjusts the PMOS transistors which constitute the inverters I1 to I3 while varying states of the control signals $c_1$ to $c_i$.

For example, when the control signal $c_1$ has a high level and other control signals $c_2$ to $c_i$ have a low level, the PMOS transistors P41, P51, and P61 are turned off and the PMOS transistors P42 to P4$i$, P52 to P5$i$ and P62 to P6$i$ are turned on, so that the PMOS transistors P11, P21 and P31 are connected in the inverters I1, I2 and I3 but the PMOS transistors P12 to P1$i$, P22 to P2$i$, and P32 to P3$i$ are not connected in the inverters I1, I2 and I3. As a result, one PMOS transistor is connected in each of the inverters I1 to I3. On the other hand, when all of the control signals $c_1$ to $c_i$ have a high level, the PMOS transistors P41 to P4$i$, P51 to P5$i$ and P61 to P6$i$ are turned off, so that the PMOS transistors P11 to P1$i$, P21 to P2$i$, and P31 to P3$i$ are connected in the inverters I1, I2 and I3. By varying the control signals $c_1$ to $c_i$ in the above described way, the cycle of the clock signal ck is set to an optimum refresh cycle in the high temperature section.

When the cycle of the clock signal ck is set to the optimum refresh cycle, it is determined whether the fuses F11 to F1$i$, F21 to F2$i$, and F31 to F3$i$ are blown out or not, and in response to the control signals $c_1$ to $c_i$, fuses corresponding thereto are blown out. Thus, the cycle of the clock signal ck is set according to an operation in the high temperature section. The MOS transistors of the ring oscillator 40 have increased electric current consumption when the temperature is raised in the high temperature section and the refresh clock signal CLK has a short cycle, and have reduced electric current consumption when the temperature is lowered in the low temperature section and the refresh clock signal CLK has a long cycle. Accordingly, during the self refresh operation, not only is the power consumption lowered but the cycle of the refresh clock signal CLK is longer as the temperature is lowered in the low temperature section.

Figure 6:
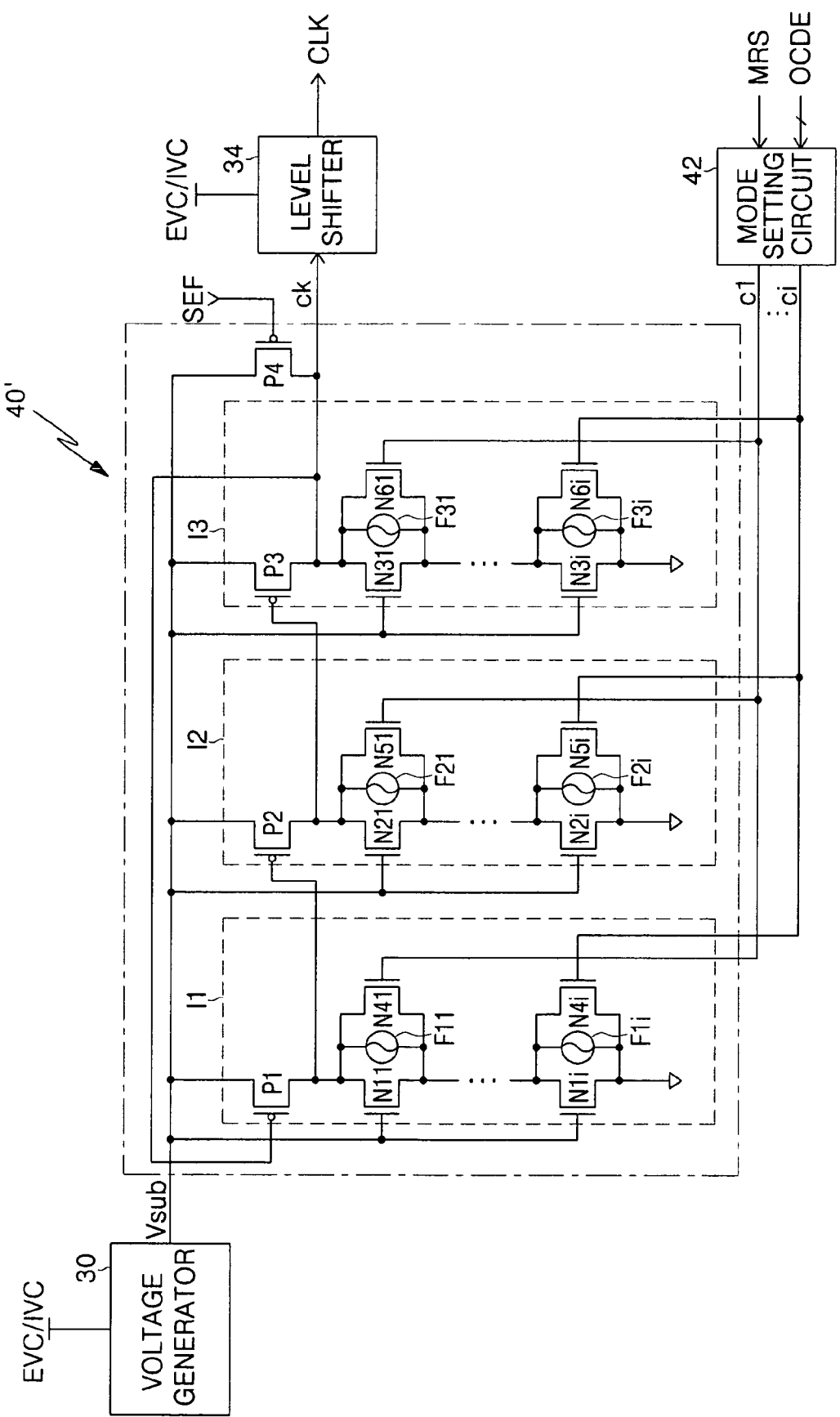
FIG. 6 is a circuit diagram illustrating a refresh clock signal generator according to a fourth exemplary embodiment of the present invention.

FIG. 6 is a circuit diagram illustrating a refresh clock signal generator of a semiconductor memory device according to a fourth embodiment of the present invention. The refresh clock signal generator of FIG. 6 includes a voltage generator 30, a level shifter 34, a ring oscillator 40', and a mode setting circuit 42. The oscillator 40' includes three inverters I1 to I3 which are cascade-connected to each other and a PMOS transistor P4. The inverter I1 includes a PMOS transistor P1, NMOS transistors N11 to N1$i$ and N41 to N4$i$, and fuses F11 to F1$i$. The inverter I2 includes a PMOS transistor P2, NMOS transistors N21 to N2$i$ and N51 to N5$i$, and fuses F21 to F2$i$. The inverter I3 includes a PMOS transistor P3, NMOS transistors N31 to N3$i$ and N61 to N6$i$, and fuses F31 to F3$i$. The inverters I1 to I3 constitute pseudo PMOS inverters.

Functions of the refresh clock signal generator of FIG. 6 will be explained below.

Since functions of the voltage generator 30 and the level shifter 34 are similar to those of FIG. 3 and a function of the mode setting circuit 42 is similar to that of FIG. 5 descriptions thereof are omitted. The ring oscillator 40' performs an operation similar to the oscillator 32' of FIG. 4 except that the ring oscillator 40' can set a cycle of the clock signal ck different than the ring oscillator 32' of FIG. 4. Since the cycle of the clock signal ck is short in a high temperature section, the cycle of the clock signal ck is set to be short. To accomplish this, the ring oscillator 40' adjusts the NMOS transistors which constitute the inverters I1 to I3 while varying states of the control signals c1 to ci.

For example, when the control signal c1 has a high level and other control signals c2 to ci have a low level, the NMOS transistors N41, N51, and N61 are turned on and the NMOS transistors N42 to N4$i$, N52 to N5$i$ and N62 to N6$i$ are turned off, so that the NMOS transistors N11, N21 and N31 are not connected but the NMOS transistors N12 to N1$i$, N22 to N2$i$, and N32 to N3$i$ are connected. As a result, only (n-1) NMOS transistors which constitute the inverters I1 to I3 are connected. On the other hand, when all of the control signals c1 to ci have a low level, the NMOS transistors N41 to N4$i$, N51 to N5$i$ and N61 to N6$i$ are turned off, so that the NMOS transistors N11 to N1$i$, N21 to N2$i$, and N31 to N3$i$ are connected. By varying the control signals c1 to ci in the above described way, the cycle of the clock signal ck is set to an optimum refresh cycle in the high temperature section.

When the cycle of the clock signal ck is set to the optimum refresh cycle, it is determined whether the fuses F11 to F1$i$, F21 to F2$i$, and F31 to F3$i$ are blown out or not, and in response to the control signals c1 to ci, fuses corresponding thereto are blown out. Thus, the cycle of the clock signal ck is set according to an operation in the high temperature section. The MOS transistors of the ring oscillator 40' have increased electric current consumption when the temperature is raised in the high temperature section and the refresh clock signal CLK has a short cycle, and have reduced electric current consumption when the temperature is lowered in the low temperature section and the refresh clock signal CLK has a long cycle. Accordingly, during the self refresh operation, not only is the power consumption lowered but the cycle of the refresh clock signal CLK is longer as the temperature is lowered in the low temperature section.

Figure 7:
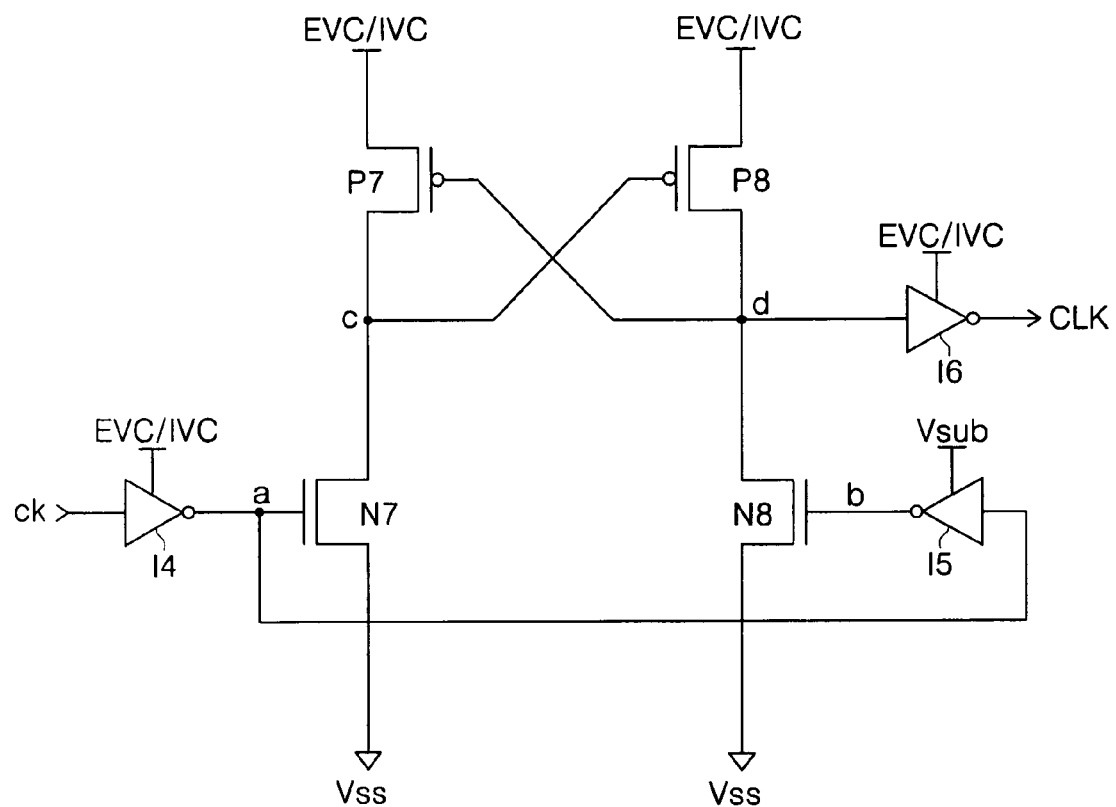
FIG. 7 is a circuit diagram illustrating a level shifter according to an exemplary embodiment of the present invention.

FIG. 7 is a circuit diagram illustrating a level shifter according to an embodiment of the present invention. The level shifter of FIG. 7 includes inverters I4 to I6, PMOS transistors P7 and P8, and NMOS transistors N7 and N8.

An operation of the level shifter of FIG. 7 will be explained below.

The inverter I4 inverts the clock signal ck to generate an inverted clock signal a. The inverter I5 inverts the clock signal a to generate a clock signal b. Here, the clock signals a and b outputted from the inverters I4 and I5 are signals which are triggered from a ground voltage to a voltage Vsub level.

When a node a has the voltage Vsub level and a node b has the ground voltage level, the NMOS transistor N7 is turned on, and the NMOS transistor N8 is turned off. Thus, a level of a node c is lowered to the ground voltage level. The PMOS transistor P8 is turned on in response to a level of the node c to make a node d have the external power voltage EVC or the internal power voltage IVC. The inverter I6 generates the refresh clock signal CLK of the ground voltage level in response to the external power voltage EVC or internal power voltage IVC level of the node d.

On the other hand, when the node a has the ground voltage level and the node b has the voltage Vsub level, the NMOS transistor N7 is turned off, and the NMOS transistor N8 is turned on. Thus, a level of the node d is lowered to the ground voltage level. The inverter I6 generates the refresh clock signal CLK of the external power voltage EVC or internal power voltage IVC level in response to the ground voltage level of the node d.

Figure 1:
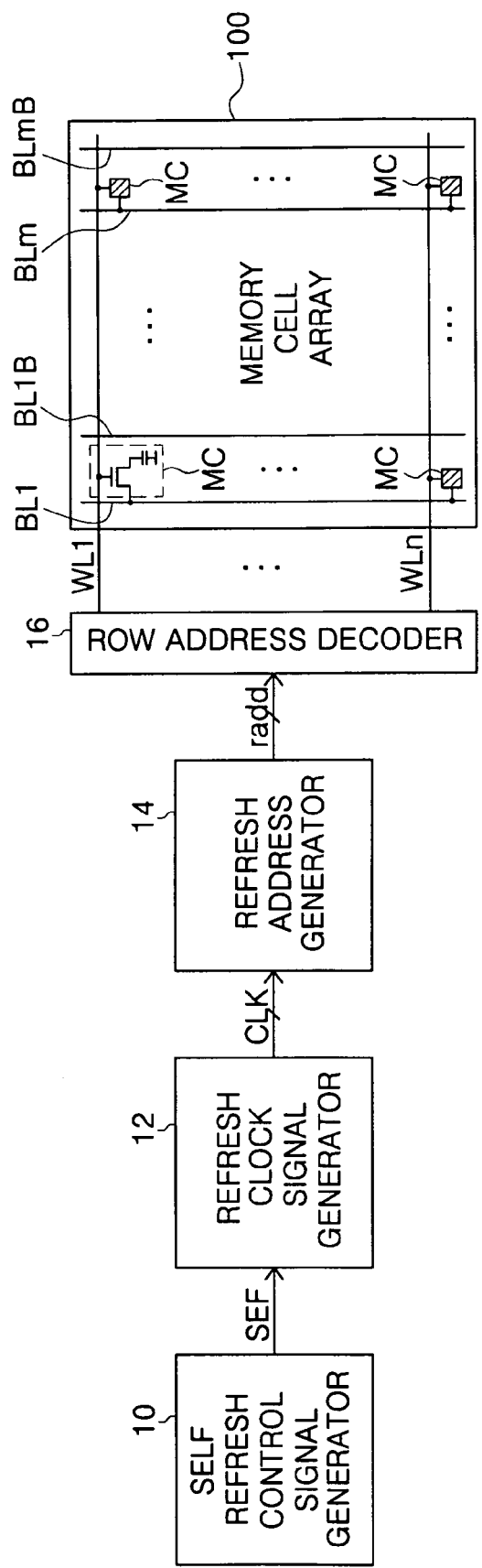
FIG. 1 is a block diagram illustrating a conventional semiconductor memory device.
Figure 2:
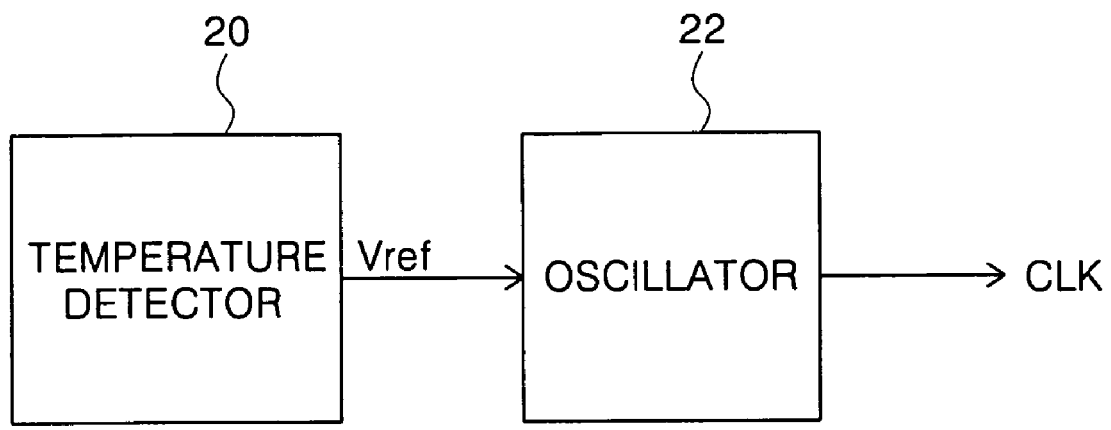
FIG. 2 is a block diagram illustrating a conventional refresh clock signal generator.

In other words, the level shifter of FIG. 7 converts the clock signal ck of the voltage Vsub level into the refresh clock signal CLK of the external power voltage EVC or internal power voltage IVC level. Thus, the refresh clock signal generator which uses the voltage Vsub as the power voltage according to an embodiment of the present invention can be interfaced with the refresh address generator 14 of FIG. 1 which uses the external power voltage EVC or internal power voltage IVC as the power voltage.

As described above, a refresh clock signal generator according to an embodiment of the present invention has reduced power consumption in the low temperature section when the self refresh operation is performed because the MOS transistors which constitute the ring oscillator operate in the weak inversion region, whereas MOS transistors which constitute the conventional ring oscillator operate in a strong inversion region. Further, since consumption of the electric current flowing through the MOS transistors is reduced as the temperature is lowered, the cycle of the refresh clock signal is longer.

In the above described embodiments, although the inverters of the ring oscillator of the refresh clock signal generator include pseudo NMOS or PMOS inverters, they can also include CMOS inverters. For example, instead of configuring the gates of the PMOS transistors P1 to P3 to receive the ground voltage, the gates of the NMOS transistors N1 to N3 can be commonly connected. In addition, although the ring oscillator of the refresh clock signal generator according to an embodiment of the present invention has been described to include three inverters, the refresh clock signal generator can include, for example, an odd number of five or more inverters.

Further, the ring oscillator of the refresh clock signal generator according to an embodiment of the present invention can be configured such that the PMOS transistors and the fuses (P11 to P1$i$, F11 to F1$i$, and P41 to P4$i$), (P21 to P2$i$, F21 to F2$i$, and P51 to P5$i$), and (P31 to P3$i$, F31 to F3$i$, and P61 to P6$i$) of FIG. 5 are connected to the NMOS transistors and the fuses (N11 to N1$i$, F11 to F1$i$, and N41 to N4$i$), (N21 to N2$i$, F21 to F2$i$, and N51 to N5$i$), and (N31 to N3$i$, F31 to F3$i$, and N61 to N6$i$) of FIG. 6.

The semiconductor memory device and the refresh clock signal generator thereof according to an embodiment of the present invention can reduce power consumption and increase a cycle of a refresh clock signal as a temperature is lowered in a high temperature section during a self refresh operation.

While the present invention has been particularly illustrated and described with reference to exemplary embodiments thereof, it will be understood by those of ordinary skill in the art that various changes in form and details may be made therein without departing from the spirit and scope of the present invention as defined by the following claims.

What is claimed is:

1. A refresh clock signal generator of a semiconductor memory device, comprising:
   a voltage generator for receiving a power voltage to generate a voltage which is lower than the power voltage;
   a ring oscillator enabled in response to a self refresh control signal, including an odd number of at least three inverters, having a first current consumption when a temperature of the semiconductor memory device is high and a second current consumption when the temperature is low, and generating a clock signal whose cycle is increased as the temperature is lowered; and
   a level shifter for converting the clock signal of the voltage which is lower than the power voltage into a refresh clock signal which has a level of the power voltage.

2. The refresh clock signal generator of claim 1, wherein the at least three inverters are at least three pseudo NMOS inverters which are cascade-connected; and the ring oscillator includes a reset transistor for resetting the clock signal in response to the self refresh control signal.

3. The refresh clock signal generator of claim 2, wherein each of the pseudo NMOS inverters includes:
   a PMOS transistor and an NMOS transistor which are serially connected between the voltage which is lower than the power voltage and a ground voltage,
   wherein a gate of the PMOS transistor is connected to the ground voltage, an output signal of a previous inverter is applied to a gate of the NMOS transistor, and the PMOS transistor and the NMOS transistor operate in a weak inversion region.

4. The refresh clock signal generator of claim 2, wherein each of the pseudo NMOS inverters includes:
   first PMOS transistors and an NMOS transistor which are serially connected between the voltage which is lower than the power voltage and a ground voltage;
   fuses which are respectively connected in parallel to the first PMOS transistors; and
   second PMOS transistors which are respectively connected in parallel to the first PMOS transistors and which are controlled by control signals,
   wherein gates of the first PMOS transistors are connected to the ground voltage, an output signal of a previous inverter is applied to a gate of the NMOS transistor, and the first PMOS transistors and the NMOS transistor operate in a weak inversion region.

5. The refresh clock signal generator of claim 2, further comprising,
   a mode setting circuit for receiving an externally applied code to generate at least one of the control signals in response to a mode setting command during a mode setting operation.

6. The refresh clock signal generator of claim 1, wherein the at least three inverters are at least three pseudo PMOS inverters which are cascade-connected; and the ring oscillator includes
   a reset transistor for resetting the clock signal in response to the self refresh control signal.

7. The refresh clock signal generator of claim 6, wherein each of the pseudo PMOS inverters includes:
   a PMOS transistor and an NMOS transistor which are serially connected between the voltage which is lower than the power voltage and a ground voltage,
   wherein the voltage which is lower than the power voltage is applied to a gate of the NMOS transistor, an output signal of a previous inverter is applied to a gate of the PMOS transistor, and the PMOS transistor and the NMOS transistor operate in a weak inversion region.

8. The refresh clock signal generator of claim 6, wherein each of the pseudo PMOS inverters includes:
   first NMOS transistors and a PMOS transistor which are serially connected between the voltage which is lower than the power voltage and a ground voltage;
   fuses which are respectively connected in parallel to the first NMOS transistors; and
   second NMOS transistors which are respectively connected in parallel to the first NMOS transistors and which are controlled by control signals,
   wherein gates of the first NMOS transistors are connected to the voltage which is lower than the power voltage, an output signal of a previous inverter is applied to a gate of the PMOS transistor, and the first NMOS transistors and the PMOS transistor operate in a weak inversion region.

9. The refresh clock signal generator of claim 8, further comprising,
   a mode setting circuit for receiving an externally applied code to generate at least one of the control signals in response to a mode setting command during a mode setting operation.

10. The refresh clock signal generator of claim 1, wherein the at least three inverters are at least three pseudo CMOS inverters which are cascade-connected; and the ring oscillator includes
    a reset transistor for resetting the clock signal in response to the self refresh control signal.

11. The refresh clock signal generator of claim 10, wherein each of the pseudo CMOS inverters includes:
    one PMOS transistor and one NMOS transistor which are serially connected between the voltage which is lower than the power voltage and a ground voltage,
    wherein the PMOS transistor and the NMOS transistor operate in a weak inversion region.

12. The refresh clock signal generator of claim 1, wherein the level shifter includes first through third inverters, first and second PMOS transistors and first and second NMOS transistors, wherein the first inverter for receiving the clock signal of the voltage which is lower than the power voltage is connected to a gate of the first NMOS transistor, the second inverter for receiving an inverted version of the clock signal of the voltage which is lower than the power voltage is connected to a gate of the second NMOS transistor, and the third inverter for outputting the refresh clock signal is connected to a node between the second PMOS transistor and the second NMOS transistor.

13. The refresh clock signal generator of claim 1, wherein the first current consumption is greater than the second current consumption.

14. The refresh clock signal generator of claim 13, wherein the first current consumption is increased as the temperature is raised when the temperature is high and the second current consumption is decreased as the temperature is lowered when the temperature is low.

15. A semiconductor memory device, comprising:
    a self refresh control signal generator for counting a self refresh cycle to generate a self refresh control signal;
    a refresh clock signal generator for generating a refresh clock signal in response to the self refresh control signal;

a refresh address generator for generating a refresh row address in response to the refresh clock signal;

a row decoder for generating word line selecting signals for selecting one of a plurality of word lines in response to the refresh row address; and a memory cell array including a plurality of memory cells connected to the word lines and performing a refresh operation for the memory cells connected to the selected word line in response to the word line selecting signal, wherein the refresh clock signal generator includes:

a voltage generator for receiving a power voltage to generate a voltage which is lower than the power voltage;

a ring oscillator enabled in response to the self refresh control signal, including an odd number of at least three inverters, having a first current consumption when a temperature of the semiconductor memory device is high and a second current consumption when the temperature is low, and generating a clock signal whose cycle is increased as the temperature is lowered; and a level shifter for converting the clock signal of the voltage which is lower than the power voltage into the refresh clock signal which has a level of the power voltage.

16. The semiconductor memory device of claim 15, wherein the at least three inverters are at least three pseudo NMOS inverters which are cascade-connected; and the ring oscillator includes a reset transistor for resetting the clock signal in response to the self refresh control signal.

17. The semiconductor memory device of claim 16, wherein each of the pseudo NMOS inverters includes:

a PMOS transistor and an NMOS transistor which are serially connected between the voltage which is lower than the power voltage and a ground voltage, wherein a gate of the PMOS transistor is connected to the ground voltage, an output signal of a previous inverter is applied to a gate of the NMOS transistor, and the PMOS transistor and the NMOS transistor operate in a weak inversion region.

18. The semiconductor memory device of claim 16, wherein each of the pseudo NMOS inverters includes:

first PMOS transistors and an NMOS transistor which are serially connected between the voltage which is lower than the power voltage and a ground voltage;

fuses which are respectively connected in parallel to the first PMOS transistors; and second PMOS transistors which are respectively connected in parallel to the first PMOS transistors and which are controlled by control signals, wherein gates of the first PMOS transistors are connected to the ground voltage, an output signal of a previous inverter is applied to a gate of the NMOS transistor, and the first PMOS transistors and the NMOS transistor operate in a weak inversion region.

19. The semiconductor memory device of claim 18, wherein the refresh clock signal generator further comprises, a mode setting circuit for receiving an externally applied code to generate at least one of the control signals in response to a mode setting command during a mode setting operation.

20. The semiconductor memory device of claim 15, wherein the at least three inverters are at least three pseudo PMOS inverters which are cascade-connected; and the ring oscillator includes a reset transistor for resetting the clock signal in response to the self refresh control signal.

21. The semiconductor memory device of claim 20, wherein each of the pseudo PMOS inverters includes:

a PMOS transistor and an NMOS transistor which are serially connected between the voltage which is lower than the power voltage and a ground voltage, wherein the voltage which is lower than the power voltage is applied to a gate of the NMOS transistor, an output signal of a previous inverter is applied to a gate of the PMOS transistor, and the PMOS transistor and the NMOS transistor operate in a weak inversion region.

22. The semiconductor memory device of claim 20, wherein each of the pseudo PMOS inverters includes:

first NMOS transistors and a PMOS transistor which are serially connected between the voltage which is lower than the power voltage and a ground voltage;

fuses which are respectively connected in parallel to the first NMOS transistors; and second NMOS transistors which are respectively connected in parallel to the first NMOS transistors and which are controlled by control signals, wherein gates of the first NMOS transistors are connected to the voltage which is lower than the power voltage, an output signal of a previous inverter is applied to a gate of the PMOS transistor, and the first NMOS transistors and the PMOS transistor operate in a weak inversion region.

23. The semiconductor memory device of claim 22, wherein the refresh clock signal generator further comprises, a mode setting circuit for receiving an externally applied code to generate at least one of the control signals in response to a mode setting command during a mode setting operation.

* * * * *